(12) United States Patent
Hitko et al.

(10) Patent No.: US 8,988,173 B2
(45) Date of Patent: Mar. 24, 2015

(54) DIFFERENTIAL NEGATIVE IMPEDANCE CONVERTERS AND INVERTERS WITH VARIABLE OR TUNABLE CONVERSION RATIOS

(75) Inventors: Donald A. Hitko, Grover Beach, CA (US); Carson R. White, Agoura Hills, CA (US); Michael W. Yung, Los Angeles, CA (US); David S. Matthews, Oxnard, CA (US); Susan L. Morton, Pittsford, NY (US); Jason W. May, Santa Monica, CA (US); Joseph S. Colburn, Malibu, CA (US)

(73) Assignee: HRL Laboratories, LLC, Malibu, CA (US)

( * ) Notice: Subject to any disclaimer, the term of this patent is extended or adjusted under 35 U.S.C. 154(b) by 259 days.

(21) Appl. No.: 13/441,730

(22) Filed: Apr. 6, 2012

(65) Prior Publication Data

US 2012/0256709 A1  Oct. 11, 2012

Related U.S. Application Data

(60) Provisional application No. 61/473,076, filed on Apr. 7, 2011, provisional application No. 61/505,037, filed on Jul. 6, 2011.

(51) Int. Cl.
H03H 11/10 (2006.01)
H03H 11/48 (2006.01)

(52) U.S. Cl.
CPC ............... *H03H 11/10* (2013.01); *H03H 11/48* (2013.01)
USPC ........... 333/260; 330/254; 330/258; 330/252; 330/261; 330/217; 333/216; 333/217

(58) Field of Classification Search
USPC .......... 333/260, 217; 330/252, 261, 217, 258, 330/254; 327/259
See application file for complete search history.

(56) References Cited

U.S. PATENT DOCUMENTS 4,234,960 A    11/1980  Spilsbury
4,904,952 A  *  2/1990  Tanimoto ..................... 330/252
(Continued)

FOREIGN PATENT DOCUMENTS

EP    0295704 A2    12/1988
GB    2288502 A    10/1995
(Continued)

OTHER PUBLICATIONS

From U.S. Appl. No. 13/441,659, Office Action mailed on Feb. 24, 2014.
(Continued)

*Primary Examiner* — Stephen E Jones
*Assistant Examiner* — Scott S Outten
(74) *Attorney, Agent, or Firm* — Ladas & Parry

(57) ABSTRACT

A differential circuit topology that produces a tunable floating negative inductance, negative capacitance, negative resistance/conductance, or a combination of the three. These circuits are commonly referred to as "non-Foster circuits." The disclosed embodiments of the circuits comprises two differential pairs of transistors that are cross-coupled, a load immittance, multiple current sources, two Common-Mode Feed-Back (CMFB) networks, at least one tunable (variable) resistance, and two terminals across which the desired immittance is present. The disclosed embodiments of the circuits may be configured as either a Negative Impedance Inverter (NII) or a Negative Impedance Converter (NIC) and as either Open-Circuit-Stable (OCS) and Short-Circuit-Stable (SCS).

37 Claims, 3 Drawing Sheets

(56) References Cited

U.S. PATENT DOCUMENTS

| | | | |
|---|---|---|---|
| 5,392,002 | A | 2/1995 | Delano |
| 5,489,878 | A | 2/1996 | Gilbert |
| 6,081,167 | A | 6/2000 | Kromat |
| 6,483,480 | B1 | 11/2002 | Sievenpiper |
| 6,538,621 | B1 | 3/2003 | Sievenpiper et al. |
| 6,768,472 | B2 | 7/2004 | Alexopoulos et al. |
| 7,245,269 | B2 | 7/2007 | Sievenpiper et al. |
| 7,586,384 | B2 | 9/2009 | Ranta |
| 7,847,633 | B2 | 12/2010 | Kinget |
| 7,852,174 | B2 | 12/2010 | Cathelin |
| 7,880,568 | B2 | 2/2011 | Amin et al. |
| 8,111,111 | B2 | 2/2012 | Van Bezooijen |
| 8,263,939 | B2 | 9/2012 | Delaney |
| 8,358,989 | B2 | 1/2013 | Kakuya |
| 8,374,561 | B1 | 2/2013 | Yung |
| 8,436,785 | B1 | 5/2013 | Lai |
| 8,639,203 | B2 | 1/2014 | Robert |
| 2002/0041205 | A1 | 4/2002 | Oppelt |
| 2004/0227668 | A1 | 11/2004 | Sievenpiper |
| 2005/0184922 | A1 | 8/2005 | Ida |
| 2007/0182639 | A1 | 8/2007 | Sievenpiper et al. |
| 2008/0088390 | A1 | 4/2008 | Cathelin |
| 2008/0242237 | A1 | 10/2008 | Rofougaran |
| 2008/0284674 | A1 | 11/2008 | Herz et al. |
| 2010/0149430 | A1 | 6/2010 | Fulga |
| 2010/0225395 | A1 | 9/2010 | Patterson |

FOREIGN PATENT DOCUMENTS

| | | | |
|---|---|---|---|
| WO | 2006054246 | A1 | 5/2006 |
| WO | 2009/090244 | A1 | 7/2009 |

OTHER PUBLICATIONS

IPRP for related PCT/US2012/045632 mailed on Jul. 10, 2013.

IPRP for related PCT/US2012/32638 mailed on Jun. 27, 2013.

ISR for related PCT/US/2012/032638 mailed on Oct. 29, 2012.

ISR for related PCT/US2012/032648 Dec. 14, 2012.

From U.S. Appl. No. 12/768,563 (now U.S. Patent No. 8,374,561), Application and Office Actions including but not limited to the Office Actions dated Jun. 13, 2012; Oct. 9, 2012; and Oct. 23, 2012.

From U.S. Appl. No. 13/177,479, Application and Office Actions.

From U.S. Appl. No. 13/441,659, Application and Office Actions.

From U.S. Appl. No. 13/472,396, Application and Office Actions.

PCT International Preliminary Report on Patentability (Chapter I) dated Oct. 8, 2013 for PCT Application No. PCT/US2012/032648 with PCT Written Opinion mailed on Dec. 14, 2012.

PCT Search Report and Written Opinion from PCT/US2012/045632 dated Jan. 10, 2013.

PCT Written Opinion from PCT/US2012/032638 mailed on Oct. 29, 2012.

Bezooijen, et al. "RF-MEMS based adaptive antenna matching module," IEEE Radio Frequency Integrated Circuits Symposium, p. 573-576, 2007.

Brennan, et al., "The CMOS negative impedance converter", IEEE Journal of Solid-State Circuits, 32(5), Oct. 1988.

Colburn, et al.,"Adaptive Artificial Impedance Surface Conformal Antennas", Proc. IEEE Antennas and Propagation Society Int. Symp., 2009, pp. 1-4.

Fong, et al.,"Scalar and tensor holographic artificial impedance surface", Trans. Antennas and Propag., vol. 58, pp. 3212-3221, Oct. 2010.

Gregoire, et al., "Non-foster metamaterial", Antenna Applications Symposium 2011, Sep. 2011.

Kern, D.H. Werner and M. J. Wilhelm, "Active negative impedance loaded EBG structures for the realization of ultra-wideband artificial magnetic conductor", Proc. IEEE Antennas and Propagation Society Int. Symp., 2003, pp. 427-430.

Mechkov,"A heuristic approach to teaching negative resistance phenomenon" Third International Conference—Computer Science '06, Istanbul, Turkey, Oct. 12-15, 2006 (6 pgs).

S.E. Sussman and R.M. Rudish,"Non-Foster Impedance matching for transmit applications" IEEE Xplore, EDO Corporation and Dept. of Electrical and Computer Engineering. pp. 53-56, Mar. 6-8, 2006.

S.E. Sussman-Fort and R. M. Ruddish "Non-foster impedance matching of electrically-small antennas", IEEE Trans. Antennas and Propagation 57(8). Aug. 2009, pp. 2230-2241.

S.E. Sussman-Fort and R.M. Rudish. EDO Corporation,"Increasing efficiency or bandwidth of electrically small transmit antennas by impedance matching with non-foster circuits", Progress in Electromagnetics Research Symposium 2006, Cambridge, USA, Mar. 26-29.

S.E. Sussman-Fort, "Matching network design using non-foster impedances," International Journal of RF and Microwave Computer-Aided Engineering, 16(2), pp. 135-142, Feb. 2006.

S.E. Sussman-Fort, Ph.D, Slideshow for"Matching network design using non-foster impedance," EDO Corporation (printed from the Internet on Jun. 30, 2011), (43 pages).

S.E. Sussman-Fort,"Gyrator-based biquad filters and negative impedance converters for microwaves," International Journal of RF and Microwave computer-aided engineering. 8(2):86-101, 1998.

Song and Rojas,"Non-foster impedance matching of electrically small antennas," Proc. IEEE Ant. Prop. Int. Symp., Jul. 2010.

Staple, et al. "The End of Spectrum Scarcity," published by IEEE Spectrum, Mar. 2004, pp. 1-5.

White Paper by the Virginia Tech Antenna Group of Wireless @ Virginia Tech"Non-foster reactance matching for antennas" pp. 1-5 <http://wireless.vt.edu/research/Antennas_Propagation/Whitepapers/Whitepaper-Non-Foster_Reactance_Matching_for_Antennas.pdf>.

J.G. Linvill, "Transistor Negative-Impedance Converters", Proceedings of the I.R.E., vol. 41, pp. 725-729, Jun. 1953.

S.E. Sussman-Fort, et al., Non-Foster Impedance Matching of Electrically-Small Antennas, IEEE Transactions on Antennas and Propagation, vol. 57, Aug. 2009.

R.L. Brennan, et al., "The CMOS Negative Impedance Converter", IEEE Journal of Solid-State Circuits, vol. 32, No. 5, Oct. 1988.

C. White, et al., "A Variable Negative-Inductance Integrated Circuit at UHF Frequencies", IEE Microwave and Wireless Components Letters, vol. 22, No. 1, Jan. 2012.

U.S. Appl. No. 13/177,479, filed Jul. 6, 2011, White, et al.

From U.S. Appl. No. 13/177,479 (now published as US 2013-0009720 A1), Office Action mailed on Jun. 4, 2014.

From U.S. Appl. No. 13/441,659 (now published as US 2012-0256811), Office Action mailed on Jul. 1, 2014.

From U.S. Appl. No. 13/472,396 (now published as US 2013-0009722), Office Action mailed on Jul. 30, 2014.

EPO Supplementary European Search Report with European Search Opinion dated Jul. 29, 2014 from European Patent Application No. 12767559.3.

EPO Supplementary European Search Report with European Search Opinion dated Oct. 8, 2014 from European Patent Application No. 12768357.1.

Chen, Ying et al., "Wideband Varactorless LC VCO Using a Tunable Negative-Inductance Cell", IEEE Transactions on Circuits and Systems, I: Regular Papers, IEEE, US, vol. 57, No. 10, Oct. 1, 2010, pp. 2609-2617 and II. A Principle of Tunable NI Cell, p. 2609.

Hrabar S., et al., "Towards active dispersion less ENZ metamaterial for cloaking applications", Metamaterials, Elsevier BV, NL, vol. 4, No. 2-3, Aug. 1, 2010, pp. 89-97.

Gregoire, Daniel J., et al., "Wideband Artificial Magnetic Conductors Loaded With Non-Foster Negative Inductors", IEEE Antennas and Wireless Propagation Letters, IEEE, Piscataway, NJ, US, vol. 10, Dec. 26, 2011, pp. 1586-1589.

Kern D. J., et al., "Design of Reconfigurable Electromagnetic Bandgap Surfaces as Artificial Magnetic Conducting Ground Planes and Absorbers", Antennas and Propagation Society International Symposium 2006, IEEE Albuquerque, NM, USA Jul. 9-14, 2006, Piscataway, NJ, USA, IEEE, Piscataway, NJ, USA, Jul. 9, 2006, pp. 197-200.

Ramirez-Angulo, J. et al.: "Simple technique using local CMFB to enhance slew rate and bandwidth of one-stage CMOS op-amps", Electronics Letters, IEE Stevenage, GB, vol. 38, No. 23, Nov. 7, 2002, pp. 1409-1411.

* cited by examiner

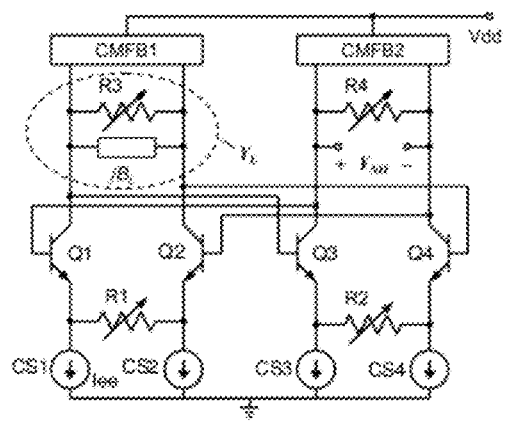
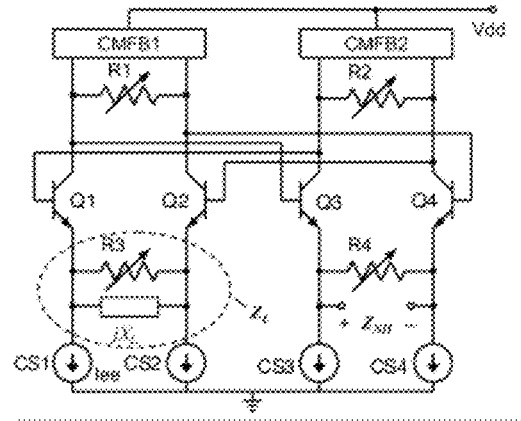
Fig. 1a
Fig. 1b
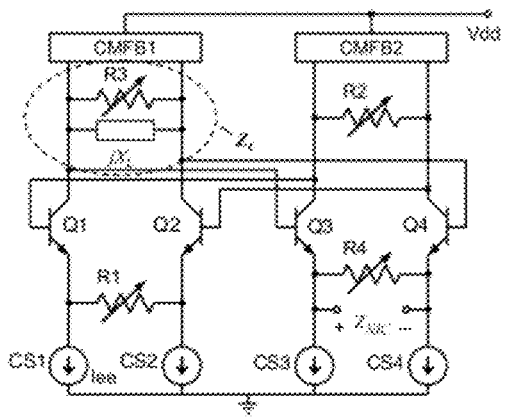
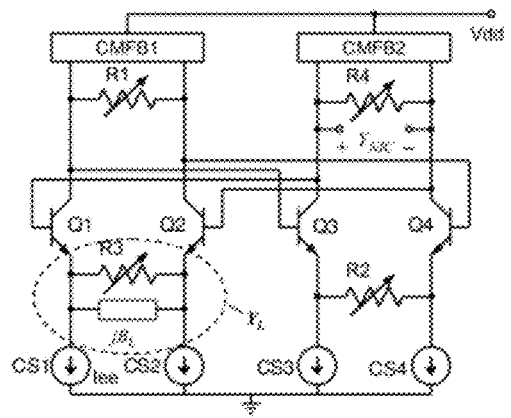
Fig. 1c
Fig. 1d

US 8,988,173 B2

DIFFERENTIAL NEGATIVE IMPEDANCE CONVERTERS AND INVERTERS WITH VARIABLE OR TUNABLE CONVERSION RATIOS

CROSS REFERENCE TO RELATED APPLICATIONS

This application claims the benefit of U.S. Provisional Application Ser. No. 61/473,076 filed on Apr. 7, 2011 and entitled "Wideband Adaptable Artificial Impedance Surface", the disclosure of which is hereby incorporated herein by reference.

This application also claims the benefit of U.S. Provisional Application Ser. No. 61/505,037 filed on Jul. 6, 2011 and entitled "Differential Negative Impedance Converters and Inverters with Tunable Conversion Ratios", the disclosure of which is hereby incorporated herein by reference.

This application is related to U.S. patent application Ser. No. 13/177,479 filed on Jul. 6, 2011 and entitled "Wide Bandwidth Automatic Tuning Circuit", the disclosure of which is hereby incorporated hereby by reference.

TECHNICAL FIELD

The present invention is directed to a differential circuit topology that produces a tunable or variable negative inductance, negative capacitance, negative resistance/conductance, or a combination of the three.

BACKGROUND

Non-Foster Circuits (NFCs) are known per se in the prior art and may be configured as either a Negative Impedance Inverter (NII) or a Negative Impedance Converter (NIC). The former converts the load immittance to its negative inverse (e.g. a capacitor is converted to a negative inductor), and the latter converts the load immittance to its negative value (e.g. a capacitor is converted to a negative capacitor).

J. G. Linvill first reported the possible existence of NIC circuits in "Transistor Negative-Impedance Converters," Proceedings of the IRE, vol. 41, pp. 725-729, in June 1953.

This invention is an improvement over the Linvill NIC, which is a single ended NIC. Linvill reported 1) a floating NIC that does not provide for NII operation and cannot be tuned by a variable resistor and 2) a grounded NIC that is single ended, and therefore is not appropriate for situations where a floating immittance is needed. The grounded NIC has the disadvantage that bias current must flow either through the load (which is problematic when the load is a capacitor) or around the load (which can cause resonances that lead to oscillation when inductors are used or decrease the performance if resistors are used). In addition, these circuits have been made using discrete transistors with bias networks made of resistive voltage division, which is a different paradigm from Integrated Circuit (IC) design, and results in lower performance when creating negative inductance and capacitance. Others have also made the single-ended Linvill circuit with discrete transistors. See, e.g., S. E. Sussman-Fort and R. M. Rudish, "Non-Foster Impedance Matching of Electrically-Small Antennas, *IEEE Transactions on Antennas and Propagation*, Vol. 57, August 2009.

R. L. Brennan, T. R. Viswanathan, and J. V. Hanson report NIC IC in CMOS, but it is a single-ended circuit it is considered only for its ability to generate negative resistance. See "The CMOS Negative Impedance Converter," *IEEE Journal of Solid-State Circuits*, vol. 32, no. 5, October 1988.

The negative impedance converter (NIC) and inverter (NII) have been known for decades, and there is a long-felt need to use them for antenna impedance matching applications. However, few have succeeded in realizing these circuits due to circuit instability (i.e. the circuits tend to oscillate). It is believed that there have been no previous demonstrations that could feasibly be produced commercially; rather they were demonstrations that had to be tweaked on the bench. This invention satisfies the need of a design that can be mass produced and has been shown to be stable under proper loading conditions.

BRIEF DESCRIPTION OF THE INVENTION

The present invention is a differential circuit topology that produces a tunable floating negative inductance, negative capacitance, negative resistance/conductance, or a combination of the three. These circuits are commonly referred to as "non-Foster circuits." The circuit comprises two differential pairs of transistors that are cross-coupled, a load immittance, multiple current sources, two Common-Mode FeedBack (CMFB) networks, at least one tunable resistance, and two terminals across which the desired immittance is present. The circuit may be configured as either a Negative Impedance Inverter (NII) or a Negative Impedance Converter (NIC).

The purpose of this invention is to create negative inductors, capacitors, and resistors (i.e. non-Foster circuits) in order to dramatically increase the bandwidth of antennas and metamaterials. It is well known that these two applications suffer from limited bandwidth, especially as attempts are made to miniaturize them and use, for example, Electrically Small Antennas (ESAs). It has been shown that non-Foster circuits can dramatically increase performance to matching circuits used to match ESAs with radio receivers and/or transmitters. However, few attempts to realize this improvement have been successful because first, these circuits are potentially unstable, and second, they must be operated with small stability margin. The most common definition of a ESA is an antenna whose maximum dimension (of an active element) is no more than $\frac{1}{2}\pi$ of a wavelength of the frequencies at which the antenna is expected to operate. So, for a dipole with a length of $\lambda/2\pi$, a loop with a diameter of $\lambda/2\pi$, or a patch with a diagonal dimension of $\lambda/2\pi$ would be considered electrically small.

The circuit disclosed herein has the following advantages: The differential topology allows the separation of the bias network from the RF stability analysis; the tunability allows the circuit to be brought near the point of instability without actually going unstable, in addition to being able to tune out parasitics; and the circuit may be implemented in an IC. The IC implementation has further advantages: reduced parasitics due to the small size, plentiful options to implement the bias network, good device matching for the differential topology, the small size permits the circuit to be placed in small gaps, and hundreds or more circuits may be realized for array applications (which would not be practical with the state of the art).

The disclosed circuit is Non-Foster Circuit (NFC) which includes two differential pairs of transistors that are cross-coupled, each transistor of the two differential pairs of transistors having a pair of current carrying electrodes and a control electrode, the control electrodes of the transistors in a first one of said two differential pairs of transistors being coupled to one of the current carrying electrodes of the transistors in a second one of said two differential pairs of transistors, the control electrodes of the transistors in the second one of said two differential pairs of transistors being coupled to one of the current carrying electrodes of the transistors in the first one of said two differential pairs of transistors; a load immittance coupled to one of the current carrying electrodes of each the transistors in said first one of said differential pair of transistors and a first control resistance coupled to another one of the current carrying electrodes of each the transistors in said first one of said differential pair of transistors; multiple current sources for supplying a flow of current to at least one of the current carrying electrodes of each of the transistors in said two differential pairs of transistors; two common-mode feedback networks, each common-mode feedback network being coupled to current carrying electrodes of the transistors of one of the two differential pairs of transistors; and terminals across which a desired immittance is present, the terminals being coupled to one of the current carrying electrodes of each the transistors in said second one of said differential pair of transistors and a second control resistance coupled to another one of the current carrying electrodes of each the transistors in said second one of said differential pair of transistors, a product of the resistances of the first and second control resistances setting a conversion ratio between the load immittance and the desired immittance.

BRIEF DESCRIPTION OF THE DRAWINGS

FIGS. 1a-1d depict four embodiments of a differential tunable NII/NIC which are either Open-Circuit-Stable (OCS) and Short-Circuit-Stable (SCS).

DETAILED DESCRIPTION

A differential circuit topology can produce a tunable floating negative inductance, negative capacitance, negative resistance/conductance, or a combination of the three. Circuits which generate negative capacitance, inductance and/or resistance are commonly referred to as "non-Foster circuits" because they violate Foster's reactance theorem for passive lossless 1-port circuits, which says that the reactance and susceptance must increase with frequency.

The circuits is shown in FIGS. 1a-1d each comprises two differential pairs of transistors (Q1, Q2 and Q3, Q4; bipolar transistors are shown, but FETs may be used instead if desired) that are cross-coupled, a load immittance ($Y_L$ or $Z_L$) connected across one differential pair, four current sources (CS1-CS4), two Common-Mode FeedBack networks (CMFB1 and CMFB2), four tunable (variable) resistors (R1-R4) connected across the differential pairs, and two terminals across which the desired immittance is present ($V_{NII}$ in FIGS. 1a and 1d; $Z_{NII}$ in FIGS. 1b and 1c). Four embodiments are shown in FIGS. 1a-1d, depicting Open-Circuit-Stable (OCS) and Short-Circuit-Stable (SCS) NII and NIC topologies. In all four embodiments, the values of resistors R1 and R2 scale the conversion ratio—leading to tunable operation—and either of them may be fixed. Resistors R3 and R4 are optional tunable resistances that may be used, for example, to tune out parasitic resistance/conductance and may be tunable, fixed, or omitted, as desired. As will be seen in the analysis below, resistor R4 does impact the immittance generated across the terminals, so if resistor R4 is utilized, the immittance generated across the terminals is affected by both the conversion ratio set by resistors R1 and R2 and by resistor R4 (if present).

FIG. 1a depicts the SCS NII embodiment with two differential pairs of cross-coupled transistors (Q1, Q2 and Q3, Q4) and two Common-Mode FeedBack networks (CMFB1 and CMFB2). Assuming ideal transistors, the input admittance is given by $$Y_{NII} = -1/[R_1 R_2 Y_L] + 1/R_4,$$

where R1 is the resistance of resistor R1, R2 is the resistance of resistor R2, etc.

In the preferred embodiment of FIG. 1a, the load $jB_L$ is simply a capacitor so that the circuit creates a negative inductance and resistor R4 may be omitted so that $1/R_4$ drops out of the equation, thereby simplifying it. The circuit is SCS, which means that it is guaranteed to be stable when the output is short-circuited. In use, a SCS circuit would typically placed in parallel with parallel resonant admittances, such as slot antennas or artificial magnetic conductor unit cells, in order to guarantee stability at DC.

Figure 2:
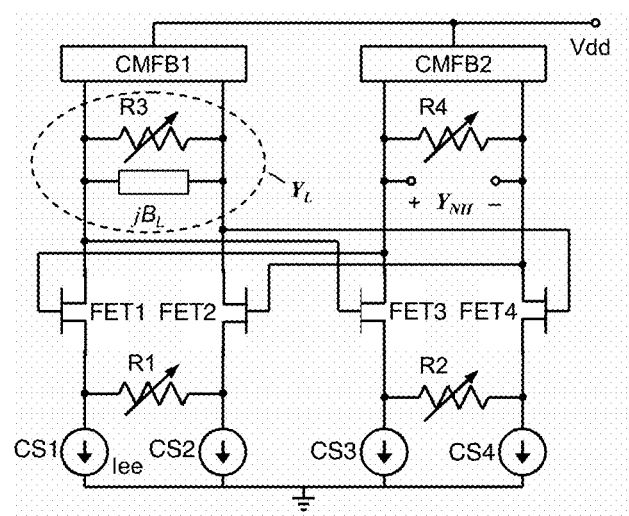
FIG. 2 is similar to FIG. 1a, showing FET transistors FET1-FET4 being substituted for bipolar transistors O1-O4.

FIG. 2 shows FETs FET1-FET4 being substituted for the bipolar transistors Q1-Q4 of FIG. 1a. This substitution is straight forward and therefore is only depicted for the SCS NII of FIG. 1a, but may be easily carried out for the NFCs of FIGS. 1b-1d as well.

FIG. 1b depicts an OCS NII, where the input impedance is given by the parallel combination of the scaled inversion of the load impedance with R4:

$Z_{NII} = (-R_1 R_2/Z_L)//R_4$ which can be rewritten as $$Z_{NII} = \frac{(-R_1 R_2/Z_L) R_4}{(-R_1 R_2/Z_L) + R_4},$$

where $R_1$ is the resistance of resistor R1, R2 is the resistance of resistor R2, etc.

The embodiment of FIG. 1b is OCS, which guarantees stability when the terminals are open circuited. For example, in use, an OCS may be placed in series with series resonant impedances, such as monopole and dipole type antennas, in order to guarantee stability at DC. In the preferred embodiment of FIG. 1b, $Z_L$ includes a capacitor which is inverted to create a negative inductance. Resistor R4 may be omitted to simplify the equations immediately above so that then:

$$Z_{NII} = R_1 R_2/Z_L.$$

OCS and SCS NIC circuits are depicted in FIGS. 1c and 1d, respectively. The input immittance assuming ideal transistors can be calculated from those of the NII by properly substituting the resistors, loads, and outputs. In the preferred embodiments, a capacitor is converted to a negative capacitor. It should be understood that other embodiments will invert/convert inductors, resistors, or combinations of capacitors, inductors, and resistors.

The conversion ratio between the load immittance and the desired immittance is a function of the product of the values of R1 and R2 in all cases, but it is also a function of the value of R4 if R4 is present. The conversion ratio is also a function of the transconductance of the cross-coupled transistors as is explained more fully in a paper entitled "A Variable Negative-Inductance Integrated Circuit at UHF Frequencies", published in *IEEE Microwave and Wireless Components Letters*, Vol. 22, No. 1, January 2012, the disclosure of which is hereby incorporated herein by reference.

Figure 3:
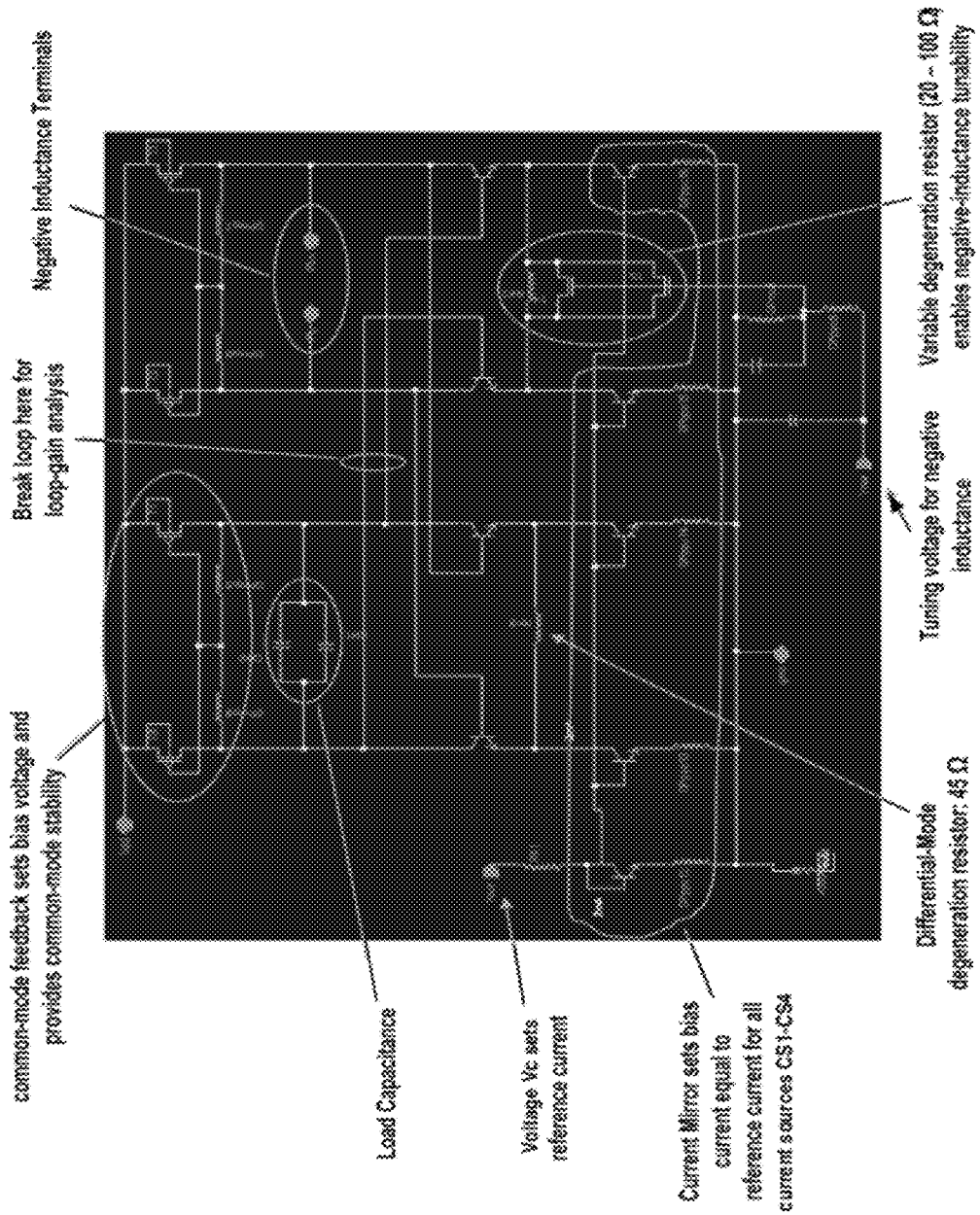
FIG. 3 depicts a schematic diagram of the tunable SCS NII that has been realized using a BiCMOS process.

This invention has been reduced to practice using a BiCMOS process. An IC has been designed and fabricated that is 1×1 mm$^2$ and has a tunable inductance from −70 nH to −40 nH corresponding to the embodiment of FIG. 1a. The entire schematic is shown in FIG. 3 showing our technique to realize CMFB1 and CMFB2, with PMOS FET transistors and resistors, and the current sources with current mirrors. This embodiment incorporated a single tunable or variable resistor, R2, which is implemented by an NMOS FET transistor preferably connected in parallel with a fixed resistor; the resistance of R2 varies as the voltage on the gate of the NMOS FET varies. In the embodiment of FIG. 3, the optional resistors R3 and R4 of FIG. 1a are not implemented. The resistors of the common-mode feedback circuits CMFB1 and CMFB2 are preferably of high resistance values and therefor have little effect in terms of the resistors of common-mode feedback circuit CMFB1, which are connected in parallel with the load capacitors, being converted to a negative resistance at the output (the Negative Inductance Terminals of FIG. 3). Also in the embodiment of FIG. 3, the four current sources CS1-CS4 of FIG. 1a are implemented with a current mirror which sets the reference current from each of the four current sources to the same value whose magnitude can be controlled by an external voltage $V_c$.

Additional discussion regarding this reduction to practice is also set forth in the paper entitled "A Variable Negative-Inductance Integrated Circuit at UHF Frequencies", published in *IEEE Microwave and Wireless Components Letters*, Vol. 22, No. 1, January 2012, noted above.

Having described the invention in connection with certain embodiments thereof, modification will now suggest itself to those skilled in the art. As such, the invention is not to be limited to the disclosed embodiments except as is specifically required by the appended claims.

What is claimed is:

1. A non-Foster circuit comprising:
    two differential pairs of transistors that are cross-coupled, each transistor of said two differential pairs of transistors having a pair of current carrying electrodes and a control electrode, the control electrodes of the transistors in a first one of said two differential pairs of transistors being coupled to one of the current carrying electrodes of the transistors in a second one of said two differential pairs of transistors, the control electrodes of the transistors in the second one of said two differential pairs of transistors being coupled to one of the current carrying electrodes of the transistors in the first one of said two differential pairs of transistors;
    a load immittance coupled to one of the current carrying electrodes of each of the transistors in said first one of said differential pair of transistors and a first control resistance coupled to another one of the current carrying electrodes of each of the transistors in said first one of said differential pair of transistors;
    current sources for supplying a flow of current to at least one of the current carrying electrodes of each of the transistors in said two differential pairs of transistors;
    two common-mode feedback networks, each common-mode feedback network being coupled to current carrying electrodes of the transistors of one of the two differential pairs of transistors; and
    terminals across which a desired immittance is generated, the terminals being coupled to one of the current carrying electrodes of each of the transistors in said second one of said differential pair of transistors and a second control resistance coupled to another one of the current carrying electrodes of each of the transistors in said second one of said differential pair of transistors, a function based at least in part on a product of the resistances of the first and second control resistances setting a conversion ratio between the load immittance and the desired immittance.

2. The non-Foster circuit of claim 1 wherein the transistors are bipolar transistors.

3. The non-Foster circuit of claim 1 wherein the transistors are FET transistors.

4. The non-Foster circuit of claim 1 wherein at least one of the first and second control resistances is variable.

5. The non-Foster circuit of claim 4 wherein said at least one of the first and second control resistances comprises at least a FET.

6. The non-Foster circuit of claim 4 wherein said at least one of the first and second control resistances comprises at least a FET and a fixed resistor connected in parallel.

7. The non-Foster circuit of claim 1 wherein the non-Foster circuit operates as an Open-Circuit-Stable Negative Impedance Converter.

8. The non-Foster circuit of claim 1 wherein the non-Foster circuit operates as an Short-Circuit-Stable Negative Impedance Converter.

9. The non-Foster circuit of claim 1 wherein the non-Foster circuit operates as an Open-Circuit-Stable Negative Impedance Inverter.

10. The non-Foster circuit of claim 1 wherein the non-Foster circuit operates as an Short-Circuit-Stable Negative Impedance Inverter.

11. The non-Foster circuit of claim 1 wherein one of more resistors are placed in parallel with the load immittance and/or the terminals across which the desired immittance is present to assist in tuning out circuit parasitics and wherein said conversion ratio is also a function of a value of a resistor placed in parallel with said terminals.

12. A non-Foster circuit comprising:
    two pairs of cross-coupled transistors;
    first connection terminals connected to first current carrying electrodes of a first one of the pairs of cross-coupled transistors and second connection terminals connected to second current carrying electrodes of said first one of the pairs of cross-coupled transistors;
    third connection terminals connected to current carrying electrodes of a second one of the pairs of cross-coupled transistors;
    current sources for supplying a flow of current to at least one of the current carrying electrodes of each pair of cross-coupled transistors;
    two common-mode feedback networks, each common-mode feedback network being coupled to current carrying electrodes of each pair of cross-coupled transistors; and
    fourth connection terminals coupled to current carrying electrodes of said second one of the pairs of cross-coupled transistors, a function based at least in part on a product of resistances of first and second control resistances connected, in use, across said second and third connection terminals setting a conversion ratio between a provided load connected, in use, across said first connection terminals and a load appearing, in use, across said fourth connection terminals.

13. The non-Foster circuit of claim 12 wherein the cross-coupled transistors are bipolar transistors.

14. The non-Foster circuit of claim 12 wherein the cross-coupled transistors are FET transistors.

15. The non-Foster circuit of claim 12 wherein at least one of the first and second control resistances is variable.

16. The non-Foster circuit of claim 15 wherein said at least one of the first and second control resistances comprises at least a FET.

17. The non-Foster circuit of claim 15 wherein said at least one of the first and second control resistances comprises at least a FET and a fixed resistor connected in parallel.

18. The non-Foster circuit of claim 12 wherein the non-Foster circuit operates as an Open-Circuit-Stable Negative Impedance Converter.

19. The non-Foster circuit of claim 12 wherein the non-Foster circuit operates as an Short-Circuit-Stable Negative Impedance Converter.

20. The non-Foster circuit of claim 12 wherein the non-Foster circuit operates as an Open-Circuit-Stable Negative Impedance Inverter.

21. The non-Foster circuit of claim 12 wherein the non-Foster circuit operates as an Short-Circuit-Stable Negative Impedance Inverter.

22. The non-Foster circuit of claim 12 wherein resistors are placed in parallel with a reactive load across said first connection terminals to assist in tuning out circuit parasitics.

23. The non-Foster circuit of claim 12 wherein said conversion ratio is also a function of a value of a resistor placed in parallel with said fourth connection terminals.

24. A non-Foster circuit comprising:
   two pairs of cross-coupled transistors;
   first connection terminals connected to first current carrying electrodes of a first one of the pairs of cross-coupled transistors and second connection terminals connected to second current carrying electrodes of said first one of the pairs of cross-coupled transistors;
   third connection terminals connected to current carrying electrodes of a second one of the pairs of cross-coupled transistors;
   current sources for supplying a flow of current to at least one of the current carrying electrodes of each pair of cross-coupled transistors;
   two common-mode feedback networks, each common-mode feedback network being coupled to current carrying electrodes of each pair of cross-coupled transistors; and
   fourth connection terminals coupled to current carrying electrodes of said second one of the pairs of cross-coupled transistors.

25. The non-Foster circuit of claim 24 wherein the cross-coupled transistors are bipolar transistors.

26. The non-Foster circuit of claim 24 wherein the cross-coupled transistors are FET transistors.

27. The non-Foster circuit of claim 24 wherein at least one of the first and second control resistances is variable.

28. The non-Foster circuit of claim 27 wherein said at least one of the first and second control resistances comprises at least a FET.

29. The non-Foster circuit of claim 27 wherein said at least one of the first and second control resistances comprises at least a FET and a fixed resistor connected in parallel.

30. The non-Foster circuit of claim 24 wherein the non-Foster circuit operates as an Open-Circuit-Stable Negative Impedance Converter.

31. The non-Foster circuit of claim 24 wherein the non-Foster circuit operates as an Short-Circuit-Stable Negative Impedance Converter.

32. The non-Foster circuit of claim 24 wherein the non-Foster circuit operates as an Open-Circuit-Stable Negative Impedance Inverter.

33. The non-Foster circuit of claim 24 wherein the non-Foster circuit operates as an Short-Circuit-Stable Negative Impedance Inverter.

34. The non-Foster circuit of claim 24 wherein resistors are placed, in use, in parallel with a reactive load across said first connection terminals to assist in tuning out circuit parasitics.

35. The non-Foster circuit of claim 24 wherein a conversion ratio between a reactance connected, in use, across said first connection terminals and a negative reactance appearing, in use, across said fourth connection terminals is a function based at least in part on a product of resistances of first and second control resistances connected, in use, across said second and third connection terminals.

36. The non-Foster circuit of claim 35 wherein the conversion ratio is also a function of a value of a resistor placed in parallel with said fourth connection terminals.

37. The non-Foster circuit of claim 35 wherein the conversion ratio is also a function of the transconductance of the cross-coupled transistors.

* * * * *